(12) United States Patent
Erben et al.

(10) Patent No.: US 8,658,490 B2
(45) Date of Patent: Feb. 25, 2014

(54) PASSIVATING POINT DEFECTS IN HIGH-K GATE DIELECTRIC LAYERS DURING GATE STACK FORMATION

(75) Inventors: Elke Erben, Dresden (DE); Martin Trentzsch, Dresden (DE); Richard J. Carter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 31 days.

(21) Appl. No.: 13/439,016

(22) Filed: Apr. 4, 2012

(65) Prior Publication Data

US 2013/0267086 A1   Oct. 10, 2013

(51) Int. Cl.
*H01L 21/316* (2006.01)

(52) U.S. Cl.
USPC ........... 438/216; 438/287; 438/763; 438/784; 257/E21.421; 257/E21.489

(58) Field of Classification Search
USPC ............... 438/216, 287, 763, 784, FOR. 193; 257/E21.241, E21.489, E29.132, 257/E29.165
See application file for complete search history.

(56) References Cited

U.S. PATENT DOCUMENTS

| | | | |
|---|---|---|---|
| 7,176,039 B1* | 2/2007 | Papasouliotis et al. | 438/5 |
| 7,608,539 B2* | 10/2009 | Sneh | 438/681 |
| 7,749,879 B2* | 7/2010 | Ahn et al. | 438/585 |
| 7,763,317 B2* | 7/2010 | Blackwell et al. | 427/255.11 |
| 7,902,018 B2* | 3/2011 | Kraus et al. | 438/216 |
| 8,228,725 B2* | 7/2012 | Forbes et al. | 365/184 |
| 8,269,254 B2* | 9/2012 | Ahn et al. | 257/190 |
| 2005/0108892 A1* | 5/2005 | Wu et al. | 34/444 |
| 2008/0076268 A1* | 3/2008 | Kraus et al. | 438/785 |
| 2008/0131601 A1* | 6/2008 | Kim et al. | 427/255.28 |

* cited by examiner

*Primary Examiner* — George Fourson, III
(74) *Attorney, Agent, or Firm* — Amerson Law Firm, PLLC

(57) ABSTRACT

Generally, the present disclosure is directed to techniques for improving the reliability of semiconductor devices with high-k gate dielectric layers by passivating point defects during the gate stack formation. One illustrative method disclosed herein includes performing a plurality of material deposition cycles to form a high-k dielectric layer above a semiconductor material layer, and introducing a passivating material into a gaseous precursor that is used for forming the high-k dielectric layer during at least one of the plurality of material deposition cycles.

22 Claims, 8 Drawing Sheets

PASSIVATING POINT DEFECTS IN HIGH-K GATE DIELECTRIC LAYERS DURING GATE STACK FORMATION

BACKGROUND OF THE INVENTION

1. Field of the Invention

Generally, the present invention relates to sophisticated integrated circuits, and, more particularly, to techniques for improving the reliability of semiconductor devices with high-k gate dielectric layers by passivating point defects during the gate stack formation.

2. Description of the Related Art

The fabrication of advanced integrated circuits, such as CPU's, storage devices, ASIC's (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

For many device technology generations, the gate structures of most transistor elements have comprised silicon-based materials, such as a silicon dioxide and/or silicon oxynitride gate dielectric layer, in combination with a poly-silicon gate electrode. However, as the channel length of aggressively scaled transistor elements has become increasingly smaller, many newer generation devices have turned to gate electrode stacks comprising alternative materials in an effort to avoid the short-channel effects which may be associated with the use of traditional silicon-based materials in reduced channel length transistors. For example, in some aggressively scaled transistor elements, which may have channel lengths of 14-32 nm, gate electrode stacks comprising a so-called high-k dielectric/metal gate (HK/MG) configuration have been shown to provide significantly enhanced operational characteristics over the heretofore more commonly used silicon dioxide or silicon oxynitride and polysilicon (polySiON) configurations.

Depending on the specific overall device requirements, several different high-k materials—i.e., materials having a dielectric constant, or k-value, of approximately 10 or greater—have been used with varying degrees of success for the gate dielectric layer of an HK/MG gate structure. For example, in some transistor element designs, a high-k gate dielectric layer may include hafnium oxide ($HfO_2$), tantalum oxide ($Ta_2O_5$), zirconium oxide ($ZrO_2$), titanium oxide ($TiO_2$), aluminum oxide ($Al_2O_3$), hafnium silicates ($HfSiO_x$) and the like, as well as any one of several combinations thereof, as may be required by the overall design parameters of the device. Furthermore, a metal material layer made up of one or more of a plurality of different non-polysilicon metal gate electrode materials may be formed above the high-k gate dielectric layer in HK/MG configurations so as to control the work function of the transistor, which is sometimes referred to as a work-function material, or a work-function material layer. These work-function materials may include, for example, titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

In recent years, an overall improvement in semiconductor device performance has been realized based on the use of HK/MG gate electrode configurations. However, a decrease in the reliability of HK/MG devices may sometimes occur as a result of various processing-induced defects, such as point defects, e.g., dangling bonds and the like, that may be present in the high-k dielectric bulk material, or at the interface between the high-k dielectric layer and the underlying interfacial silicon dioxide or silicon oxynitride layer. In some instances, these point defects can lead to a decrease in the time dependent dielectric breakdown (TDDB) of the device, or to an increase in bias temperature instability (BTI), either of which may result in a decrease in the overall reliability of HK/MG devices.

One prior art method that has been used to at least incrementally address the defect-related reliability problems described above is by increasing the thickness of the high-k dielectric layer, increasing the thickness of the interfacial layer or increasing the thickness of both layers. However, it should be noted that simply increasing the thicknesses of the high-k dielectric layer and/or interfacial layer has somewhat limited benefits in many device applications, as some device parameters, such as, for example, threshold voltage, device performance and the like, may be detrimentally affected by the increased thicknesses. Accordingly, this approach is typically only utilized when the equivalent oxide thickness (EOT) adjustments of the interfacial layer plus high-k film thickness do not exceed approximately 0.2 Å, as the detrimental effects associated with an increased EOT of more than about 0.2 Å may outweigh the incremental benefits it may otherwise provide.

Another prior art approach that has been used to address the point defect problems associated with high-k dielectric layers as described above is to perform an implantation process to implant ions of a chemical element, such as fluorine and the like, that is known to passivate point defects in and around high-k dielectric layers of the type that may be created during HK/MG device processing. FIGS. 1a-1d depict some illustrative prior art implantation processes, which are generally described below.

FIG. 1a schematically illustrates a semiconductor device 100 in an early manufacturing stage of, for example, a gate-first technique for forming HK/MG transistor elements, wherein an insulating portion of a gate electrode material stack has been formed in advance of forming a layer of gate electrode material and patterning the material stack to form a gate structure. The semiconductor device 100 of FIG. 1a includes a substrate 101 and a semiconductor layer 102 formed thereabove. The semiconductor device 100 also includes an interfacial layer 103 that has been formed on the semiconductor layer 102, which may be on the order of 4-6 Å thick, and which may be made up of, for example, silicon dioxide or silicon oxynitride. A high-k dielectric layer 104 having thickness of approximately 1-2 nm and comprising, for example, hafnium oxide has also been formed above the interfacial layer 103.

FIG. 1b schematically illustrates a close-up view of the semiconductor device 100, and more specifically, the close-up view in the area of the interfacial layer 103 and the high-k dielectric layer 104. As shown in FIG. 1b, point defects 104p may be present in the high-k dielectric layer 104 and/or near an interface 103f between the interfacial layer 103 and the high-k dielectric layer 104.

During the manufacturing stage illustrated in FIGS. 1a and 1b, an implantation process 120 is performed to implant, for example, fluorine ions, into the high-k dielectric layer 104 so as to passivate the point defects 104p. However, due to the fact that the high-k dielectric layer 104 is very thin, e.g., on the order of 1-2 nm as noted above, relatively low implantation energies would generally be necessary to appropriately adjust the position of the implanted ions in such a thin layer. As such, it can be difficult to control the implantation process 120 in such a manner so as to obtain a consistent ion density throughout, or a specific position within, the high-k dielectric layer 104. Accordingly, the implantation process 120 may not readily lend itself to the typical production environment, as it may not always provide a precisely repeatable, and therefore reliable, passivation treatment of the point defects 104p.

FIG. 1c schematically illustrates another prior art process that has been used for passivating the point defects 104p that is similar to that illustrated in FIGS. 1a-1b, as described above. However, as shown in FIG. 1c, a sacrificial layer 112 has been formed above the high-k dielectric layer 104 prior to performing an implantation process 121 that is used to implant, for example, fluorine ions, into the high-k dielectric layer 104. The sacrificial layer 112 may be any suitable material that can be selectively removed with respect to the high-k dielectric layer 104 during a later manufacturing stage, such as a metal material or polysilicon, and the like. Depending on the implantation energy used during the implantation process 121, controllability of the ion density in and around the area of the high-k dielectric layer may be enhanced to some degree when compared to the implantation process 120 described with respect to FIG. 1b above. However, precise control and repeatability of the overall implantation process, and therefore overall device reliability, may still be difficult to achieve. Moreover, the use of a sacrificial layer 112 will generally tend to increase process integration complexity (and therefore device cost) due to the additional processing steps that are required first to deposit the layer 112, and then to remove the layer 112 prior to forming the remaining layers of the HK/MG gate material stack.

FIG. 1d schematically illustrates yet another prior art implantation process, wherein a semiconductor device 100 is in a substantially advanced manufacturing stage as compared to methods illustrated in FIGS. 1a-1c above. As shown in FIG. 1d, a gate patterning process has been performed so as to form a gate structure 110 that includes the interfacial layer 103, the high-k gate dielectric layer 104 and a gate electrode 105 above the semiconductor layer 102. In a so-called "gate first" approach, the gate electrode 105 may be, for example, a metal gate electrode, and may include, as appropriate, a work-function material layer as described above, whereas, in a so-called "gate last" approach, the gate electrode 105 may be, for example, polysilicon. In many process integration schemes, after the gate structure 110 has been formed, an implantation sequence is generally performed so as to form source and drain regions (not shown) of the device in the semiconductor layer 102 adjacent to the sidewalls of the gate structure 110. Depending on the overall device requirements, sidewall spacers (not shown) may be formed on or adjacent to the sidewalls of the gate structure 110 prior to and/or during the implantation sequence.

As shown in FIG. 1d, the implantation sequence that is used to form the source and drain regions of the semiconductor device 100 is adjusted to include a tilt-angle implantation process 122 that is designed to implant, for example, fluorine ions so as to passivate any point defects 104p as previously described. However, in many cases, due to the masking or shielding effect of the gate electrode 105, the region 110r of the gate structure 110 into which the ions are implanted during the tilt-angle implantation process 122 may be limited, e.g., to a distance 110L, such that only the edge regions 104e of the high-k dielectric layer 104 may be effectively passivated. As such, the implantation method illustrated in FIG. 1c generally has limited application to those devices having gate lengths and/or gate widths that are within certain dimensional limitations, such as on the order of approximately 10-30 nm.

Accordingly, there is a need to develop processing techniques that are adapted to passivating point defects that may be formed in and around the high-k gate dielectric layer and interfacial layer of HK/MG devices. The present disclosure is directed to various methods that may avoid, or at least reduce, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to techniques for improving the reliability of semiconductor devices with high-k gate dielectric layers by passivating point defects during the gate stack formation. One illustrative method disclosed herein includes performing a plurality of material deposition cycles to form a high-k dielectric layer above a semiconductor material layer, and introducing a passivating material into a gaseous precursor that is used for forming the high-k dielectric layer during at least one of the plurality of material deposition cycles.

Also disclosed herein is an illustrative method that includes forming a layer of high-k dielectric material above a semiconductor layer of a semiconductor device by performing an atomic layer deposition process comprising a plurality of self-limiting deposition cycles, wherein performing each of the plurality of self-limiting deposition cycles includes forming a sub-layer of the layer of high-k dielectric material by exposing the semiconductor device to a deposition ambient that includes a first gaseous precursor, wherein the first gaseous precursor includes a material component of the layer of high-k dielectric material. Furthermore, the disclosed method includes modifying the deposition ambient during at least one of the plurality of self-limiting deposition cycles to further include a second gaseous precursor, the second gaseous precursor being made up of, among other things, a passivating material.

In another illustrative method of the present disclosure, an interfacial layer is formed above a semiconductor layer of a semiconductor device, and an atomic layer deposition process is performed to deposit a high-k dielectric layer above the interfacial layer, wherein performing the atomic layer deposition process includes exposing the semiconductor device to a first gaseous precursor. The method further includes incorporating a passivating material into the high-k dielectric layer, wherein incorporating the passivating material includes, among other things, combining a second gaseous precursor with the first gaseous precursor during at least one deposition cycle of the atomic layer deposition process. Additionally, the disclosed method also includes controlling an amount of the passivating material that is incorporated into the high-k dielectric layer by adjusting at least one of a reaction temperature, chamber pressure, flow rate of the first gaseous precursor and flow rate of the second gaseous precursor during the at least one deposition cycle.

BRIEF DESCRIPTION OF THE DRAWINGS

The disclosure may be understood by reference to the following description taken in conjunction with the accompanying drawings, in which like reference numerals identify like elements, and in which.

Figure 1A:
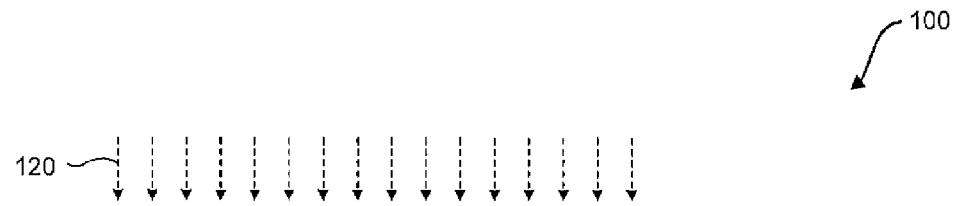
FIGS. 1a-1d schematically illustrate representative prior art embodiments of performing ion implantation processes to passivate point defects in a high-k dielectric layer.
Figure 1B:
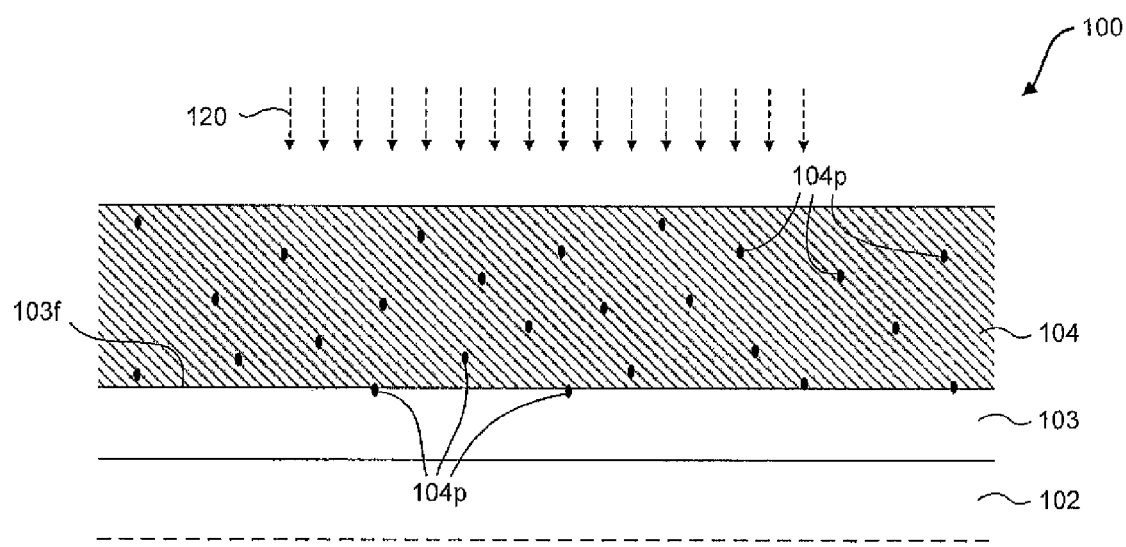
Figure 1C:
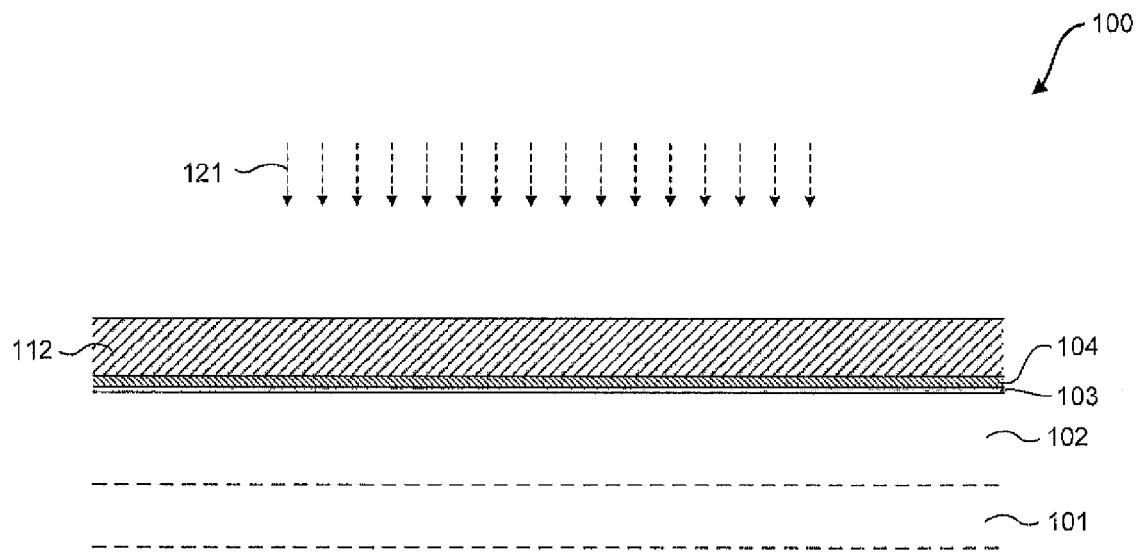
Figure 1D:
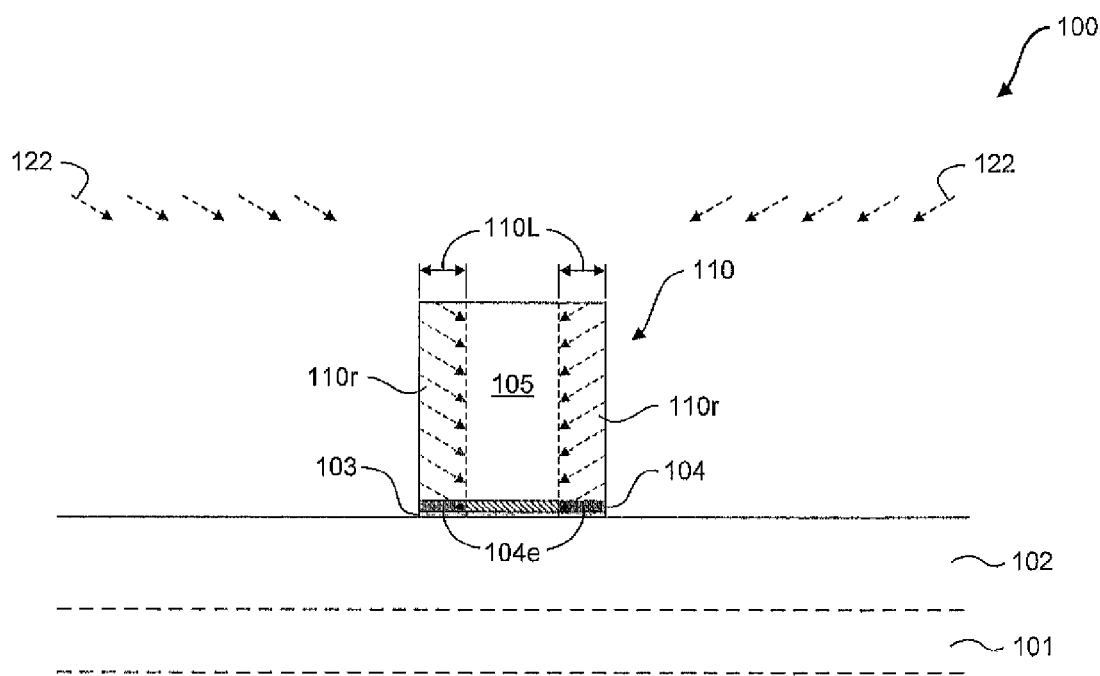

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter of the present disclosure is directed to, among other things, methods for incorporating an appropriate passivating material into a high-k dielectric layer, such as, for example, of a HK/MG electrode structure of a CMOS transistor element, so as to passivate point defects that may be created during the deposition of the high-k material. In some embodiments of the present disclosure, the high-k dielectric layer may be formed above a semiconductor layer of a semiconductor device using a suitable material deposition process, such as an atomic layer deposition (ALD) process. During an ALD process, a plurality of self-limiting material deposition cycles may be performed during which a surface may be exposed to a gaseous precursor material so as to incrementally increase the thickness of a given layer by forming numerous conformal material sub-layers. In many cases, each of the self-limiting material deposition cycles may include sequential pulse/purge steps, as follows:

1) a first pulse step to expose a surface where the material layer is to be formed to a gaseous precursor, during which a material component of the gaseous precursor may bond to the surface by undergoing a thermal decomposition. The gaseous precursor may include a material component of the eventual material layer, such as an appropriate organometallic and/or inorganic compound, and the like;

2) a first purge or evacuation step of the reaction chamber to remove the reaction byproducts, as well as any unreacted gaseous precursor material, from the first pulse step;

3) a second pulse step to expose the surface of the material that was deposited during the first pulse step to an appropriate oxidant, such as water or ozone, so as to prepare the surface for another reaction with the gaseous precursor during a subsequent material deposition cycle; and 4) a second purge or evacuation step of the reaction chamber to remove the oxidant.

As noted above, the gaseous precursor may include a material component of the layer of material to be deposited. For example, when the high-k dielectric layer is made up of, e.g., hafnium dioxide and the like, the gaseous precursor that is "pulsed" into the reaction chamber during the first pulse step may, in certain embodiments, include hafnium tetrachloride ($HfCl_4$). Furthermore, the reaction temperature under which the material of the gaseous precursor, e.g., hafnium tetrachloride, thermally decomposes and bonds to the exposed surface may be controlled by controlling the temperatures of at least one of the following: 1) the reaction chamber; 2) the surface where the material layer is to be deposited (e.g., the substrate surface); and/or 3) the particular gaseous precursor used.

In some illustrative embodiments of the present disclosure, an appropriate passivating material, such as fluorine or chlorine, may be incorporated into the high-k dielectric layer as the material layer is being deposited during the ALD process. For example, in at least some embodiments, the gaseous precursor that is used to deposit the various multiple sub-layers of the high-k dielectric layer as previously described may be a first gaseous precursor of an ALD deposition ambient. Furthermore, one of the passivating materials noted above may be included in a second gaseous precursor, and the second gaseous precursor may be combined with the first gaseous precursor to create a modified deposition ambient. Accordingly, in this fashion, at least some amount of the passivating material of the second gaseous precursor may also be included as a component of the high-k dielectric layer. In those illustrative embodiments wherein the passivating material may be, for example, fluorine, the second gaseous precursor may be, for example, nitrogen trifluoride ($NF_3$) or hydrogen tetrafluoride ($HF_4$) and the like. However, it should be appreciated that other solid and/or liquid compounds that are adapted to form other gaseous precursors containing, e.g., fluorine or chlorine compounds that are reactive within the particular temperature range that fits with the reaction temperature requirements of the specified ALD process may also be used.

Furthermore, when utilizing the above-described gaseous precursor approach, the amount and/or concentration of the passivating material that is incorporated into the high-k dielectric layer may be "tuned," or adjusted, in a highly controllable manner, as compared to the previously described implantation methods known in the art. For example, any one or more of the various parameters used during the ALD process may be adjusted so as to "tune" the composition of the high-k dielectric layer, such as the reaction temperature, the chamber pressure and/or the flow rates of the various gaseous precursors.

It should be further understood that the above-described process may be adjusted so that the passivating material may only be incorporated into specific sub-layers of the overall high-k dielectric layer. For example, in certain embodiments, the second gaseous precursor may only be utilized during the first of several self-limiting deposition cycles of the ALD process and thereafter discontinued so that only the first gaseous precursor is present in the deposition ambient. In other embodiments, use of the second gaseous precursor may be delayed until one or more sub-layers of the high-k dielectric layer have been deposited based only upon the use of the first gaseous precursor. In still further embodiments, the second gaseous precursor may be alternatingly used and discontinued in consecutive groups of material deposition cycles, wherein each alternating group may be made up of either one deposition cycle or a plurality of consecutive cycles. However, it should be appreciated that the above-described deposition cycle and sub-layer combinations are exemplary only, and should not be construed in any way as being a limitation on the scope of the present disclosure.

Moreover, in some embodiments, the exposed surfaces may be subjected to a gaseous treatment ambient during one or more of the pulse steps of the ALD process, wherein first gaseous precursor may be temporarily discontinued, whereas the second gaseous precursor may still be present. During the gaseous treatment ambient of the exposed surface, point defects that are present at the surface, such as dangling bonds and the like, may be passivated without any material of the high-k dielectric layer being deposited. For example, as noted previously, point defects may sometimes be present at or near the interface of the high-k dielectric layer and the underlying interfacial layer that is formed on the semiconductor layer of a device. Accordingly, in certain embodiments, the surface of the interfacial layer may be exposed to the gaseous treatment ambient so as to passivate point defects located on or near the surface of the interfacial layer prior to performing the initial self-limiting material deposition cycle—i.e., prior to forming the initial sub-layer of the high-k dielectric layer. Furthermore, it should be appreciated that any one or more of the sub-layers of the high-k dielectric layer may be subjected to the gaseous treatment ambient during the ALD process.

FIGS. 2a-2e, 3a-3e and 4-5, which schematically depict some of the illustrative embodiments of the present disclosure discussed above, will be described in further detail below. It should be noted that, where appropriate, the reference numbers used in describing the various elements shown in the illustrative embodiments of FIGS. 2a-2e, 3a-3e and 4-5 may substantially correspond, where appropriate, to the reference numbers used in describing related elements illustrated in FIGS. 1a-1d above, except that the leading numeral in each figure has been changed from a "1" to a "2," "3," "4" or "5," where appropriate. For example, the semiconductor layer "102" corresponds to the semiconductor layers "202," "302," "402" and "502," the high-k dielectric layer "104" corresponds to the high-k dielectric layers "204," "304," "404" and "504," and so on. Accordingly, the reference number designations used to identify some elements of the presently disclosed subject matter may be illustrated in FIGS. 2a-2e, 3a-3e and 4-5 but may not be specifically described in the following disclosure. In those instances, it should be understood that the numbered elements shown in FIGS. 2a-2e, 3a-3e and 4-5 which are not described in detail below substantially correspond with their like-numbered counterparts illustrated in FIGS. 1a-1d and described in the associated disclosure set forth above.

Furthermore, it should also be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the semiconductor device 100 depicted in FIG. 1a, it should be understood that the high-k dielectric layer 104 is positioned "above" the interfacial layer 103, whereas, in special cases, the high-k dielectric layer 104 may be positioned "on" the interfacial layer 103 in those configurations where no other layers or structures are interposed therebetween. Similarly, it should also be appreciated that the substrate 101 is positioned "below" or "under" the semiconductor layer 102.

Figure 2A:
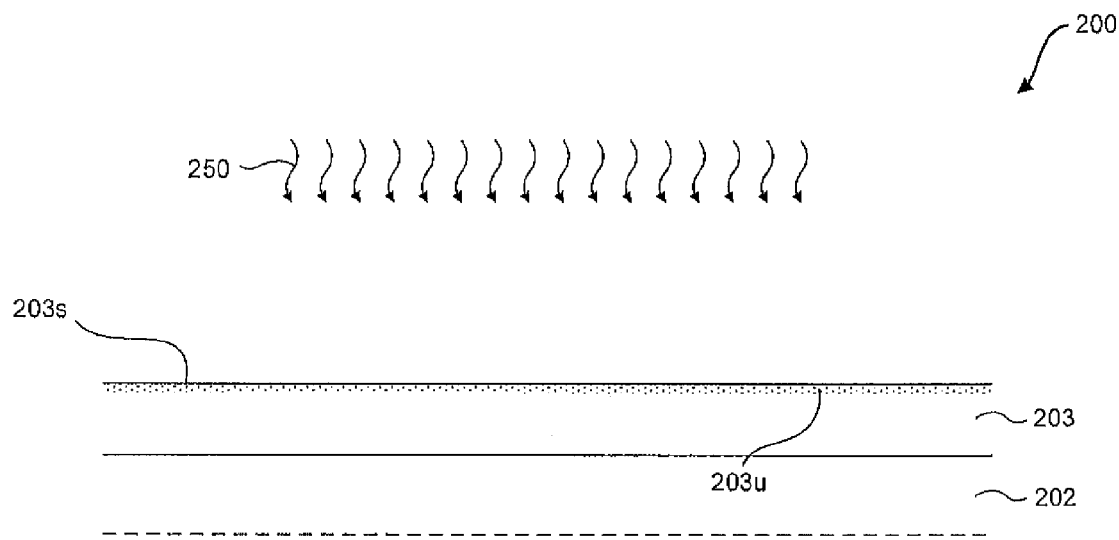
FIGS. 2a-2e schematically depict one illustrative embodiment of the techniques disclosed herein.

FIG. 2a schematically illustrates a semiconductor device 200 during an early stage of manufacturing, wherein an interfacial layer 203, such as silicon dioxide or silicon oxynitride and the like, has been formed above a semiconductor layer 202, such as a silicon-based material and the like. It should be appreciated that while not specifically shown as such in FIG. 2a, the semiconductor device 200 may also include a substrate, such as the substrate 101 shown in FIG. 1a. The semiconductor layer 202 may be formed on, or be part of, a substantially crystalline substrate material (not shown), or, when a silicon-on-insulator (SOI) device architecture is used, the semiconductor layer 202 may be formed above a buried insulating layer (not shown). The interfacial layer 203 may be a relatively thin layer, e.g., on the order of 4-6 Å, and may be formed by any one of several techniques that are well known in the art, such as, for example, by a chemical oxidation treatment, thermal oxidation treatment, or even a suitably designed material deposition process.

In the illustrative embodiment shown in FIG. 2a, the semiconductor device 200 may be subjected to gaseous treatment ambient 250 in advance of performing a self-limiting atomic layer deposition (ALD) process to form a layer of high-k dielectric material, as will be further described with respect to FIGS. 2b-2e below. In some illustrative embodiments, the gaseous treatment ambient 250 is adapted to passivate point defects, such as dangling bonds and the like, that may be present at or near the surface 203s of the interfacial layer 203. In certain embodiments, the gaseous treatment ambient 250 may include, among other things, a suitable passivating material that is known to saturate interface states at the surface 203s, such as fluorine or chlorine and the like. Furthermore, the gaseous treatment ambient 250 may take the form of, for example, a gaseous precursor that may be substantially similar to that which may be used during the subsequently performed ALD process, as described below. During exposure to the gaseous treatment ambient 250, point defects that are present in an upper portion 203u of the interfacial layer 203 may be passivated as previously described.

Figure 2B:
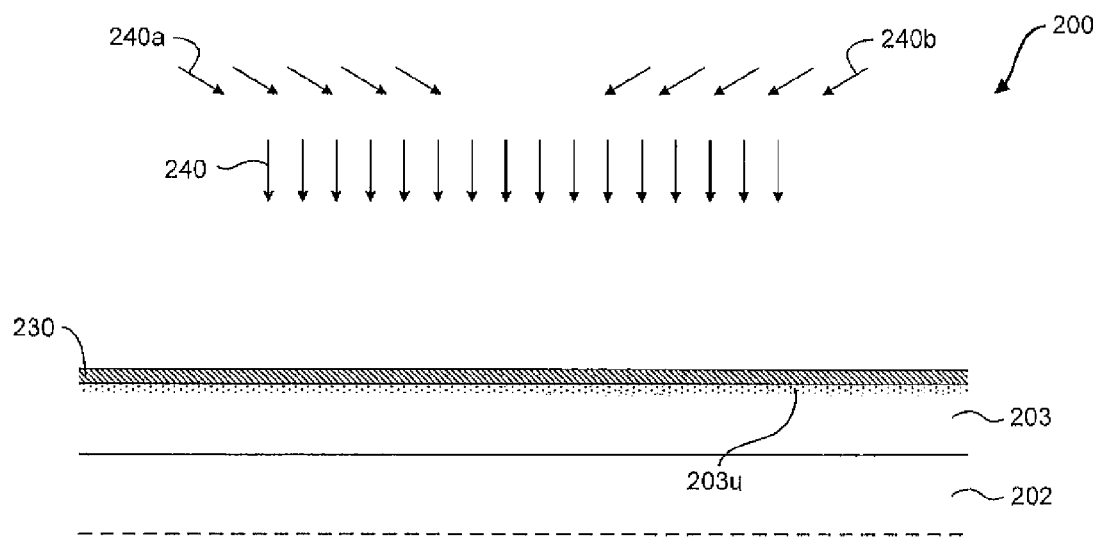

FIG. 2b schematically depicts the illustrative semiconductor device of FIG. 2a during an initial material deposition cycle 240 of an ALD process. As shown in FIG. 2b, an initial sub-layer 230 of a high-k dielectric layer 204 (see FIG. 2e) may be formed above the interfacial layer 203, an upper portion 203u of which has been previously exposed to the gaseous treatment ambient 250. In some embodiments, a first pulse step of the material deposition cycle 240 may create a deposition ambient that includes a first gaseous precursor 240a, which may be made up of, among other things, a material component of the sub-layer 230 of the high-k dielectric layer 204 that is to be formed above the interfacial layer 203. For example, in certain embodiments, the sub-layer 230 may be made up of hafnium dioxide, in which case the first gaseous precursor 240a may include hafnium tetrachloride, although other sub-layer materials and gaseous precursor materials may also be used.

Furthermore, in at least some embodiments, the deposition ambient that is created during the first pulse step of the material deposition cycle 240 may be modified to include a second gaseous precursor 240b. The second gaseous precursor 240b may contain, among other things, a suitable passivating material, such as fluorine or chlorine, that is adapted to passivate point defects that may be created in the sub-layer 230 during the material deposition cycle 240. In certain illustrative embodiments, the second gaseous precursor 230b may be nitrogen trifluoride or hydrogen tetrafluoride, when, for example, the passivating material comprises fluorine. In other illustrative embodiments, the second gaseous precursor 240b may be substantially the same as the gaseous treatment ambient 250 as described with respect to FIG. 2a above.

During the first pulse step of the material deposition cycle 240, the amount and concentration of the passivating material that is incorporated into the sub-layer 230 may be effectively controlled by "tuning," or adjusting, one or more of the various parameters of the deposition ambient that is made up of the combination of first and second gaseous precursors 240a, 240b. For example, as previously described, in certain embodiments, the reaction temperature—which may include, among other things, the temperature of the reactor chamber, the surface temperature of the semiconductor device 200 and/or the temperatures of the first and second gaseous precursors 240a, 240b—may be controllably adjusted so as to obtain the desired concentration of passivating material in the sub-layer 230. In other embodiments, the reactor chamber pressure may be appropriately adjusted, or the combined and/or individual flow rates of the first and second gaseous precursors 240a, 240b may also be controlled. Moreover, the amount and concentration of passivating material in the sub-layer 230 may be obtained by controllably adjusting any combination of the above-listed deposition ambient parameters.

Figure 2C:
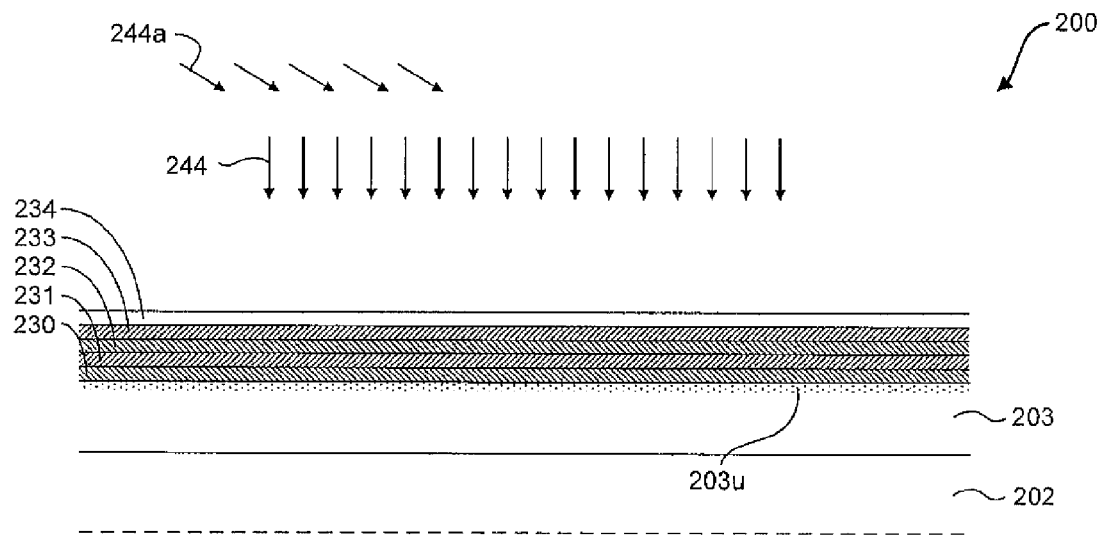

FIG. 2c schematically depicts the semiconductor device 200 of FIG. 2b after additional material deposition cycles of the ALD process have be performed, thereby forming the additional sub-layers 231, 232 and 233. In the illustrative embodiment of FIG. 2c, the sub-layers 231-233 may also include an appropriate amount of passivating material so as to passivate point defects, similar to sub-layer 230. Accordingly, in some embodiments, the deposition ambient used to form the sub-layers 231-233 may also have included a mixture of gaseous precursors, such as the first and second gaseous precursors 240a, 240b described above. Furthermore, in certain embodiments, the various parameters of the deposition ambients that may be used to form the sub-layers 231-233 may be adjusted in the same fashion as was previously used to form the sub-layer 230, thereby providing the sub-layers 231-233 with substantially the same amount and concentration of passivating material. However, in other embodiments, one or more of the various parameters may be adjusted in a different fashion from one sub-layer to the next so as to provide one or more of the sub-layers 231-233 with an individually "tuned" amount and concentration of passivating material that may vary from sub-layer to sub-layer.

As shown in FIG. 2c, the semiconductor device 200 may be exposed to a further material deposition cycle 244 so as to form a sub-layer 234. In the embodiment illustrated in FIG. 2c, the deposition ambient during the first pulse step of the material deposition cycle 244 includes a first gaseous precursor 244a, which may be substantially similar to the first gaseous precursor 240a, e.g., hafnium tetrachloride, as previously described with respect to the sub-layer 230. However, unlike the material deposition cycle 240, in some embodiments, a second gaseous precursor—e.g., comprising a suitable passivating material—is not used during the material deposition cycle 244. Accordingly, the sub-layer 234 of the high-k dielectric layer 204 (see FIG. 2e) may be formed substantially without the presence of any passivating material, other than any minor residual or trace amount that might inadvertently remain in the reactor chamber after the second purge step of any previous material deposition cycles. Furthermore, while four sub-layers 230-234 are shown in FIG. 2c that include an amount of passivating material, it should be appreciated that this illustration is schematic only, as the number of sub-layers that may be formed with an amount of passivating material, e.g., by using a combination of first and second gaseous precursors, may be varied as required by the specific device and/or material requirements.

Figure 2D:
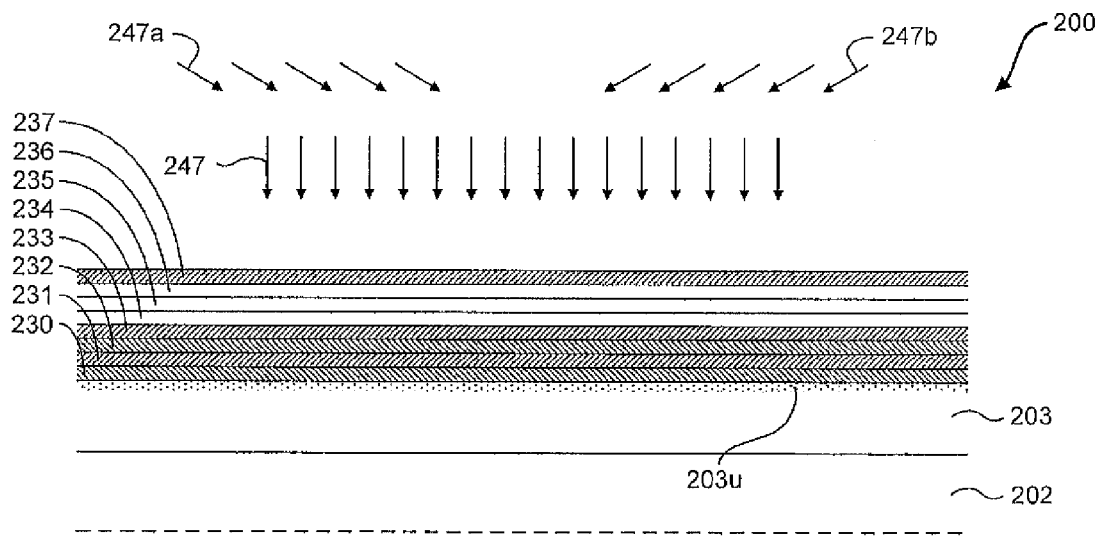

FIG. 2d schematically illustrates the semiconductor device 200 of FIG. 2c in a further advance manufacturing stage, after additional material deposition cycles of the ALD process have been performed, and additional sub-layers 235 and 236 have been formed above the sub-layer 234. As with the sub-layer 234, the additional sub-layers 235, 236 may also be formed in a deposition ambient that does not include a second gaseous precursor, i.e., substantially without a specifically controlled amount of passivating material. Thereafter, as shown in FIG. 2d, a sub-layer 237 may be formed during a further material deposition cycle 247 of the ALD, and which may also include a controlled amount of passivating material. Accordingly, the deposition ambient used during the first pulse step of the material deposition cycle 247 may be modified to include both a first gaseous precursor 247a (e.g., comprising a material component of the high-k dielectric layer 204) and a second gaseous precursor 247b (e.g., comprising an appropriate passivating material), as previously described. Furthermore, the amount and concentration of passivating material that is incorporated into the sub-layer 237 may be "tuned" to be the same as, or different than, that of the sub-layers 230-233, as described above.

Figure 2E:
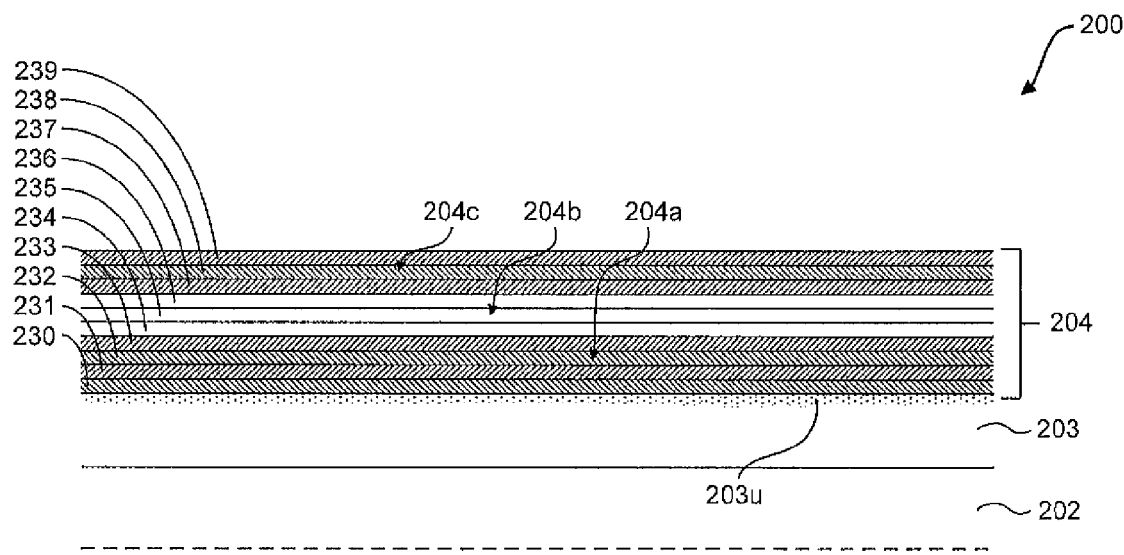

FIG. 2e schematically depicts the semiconductor device 200 after completion of the ALD process, wherein an illustrative example of a completed high-k dielectric layer 204 made up of sub-layers 230-239 has been formed above the interfacial layer 203 and the semiconductor layer 202. As shown in FIG. 2e, the illustrative high-k dielectric layer 204 of the present embodiment includes three illustrative sub-regions 204a, 204b and 204c, wherein the presence and/or the amount of passivating material may vary from sub-region to sub-region. For example, sub-region 204a is made up of sub-layers 230-233, each of which contain a controlled amount of passivating material, whereas sub-region 204b is made up of sub-layers 234-236, none of which contain a controlled amount of passivating material. Furthermore, as with the sub-region 204a, the sub-layers 237-239 of the sub-region 204c also contain a controlled amount of passivating material. Moreover, the amount of passivating material incorporated into the various sub-layers of material need not be constant, although such may be the case in some applications.

It should be understood that the semiconductor device 200 of FIG. 2e is schematically illustrative only, and that the number and material characteristics of any such sub-regions may vary from device to device. Moreover, while only ten sub-layers (i.e., sub-layers 230-239) are schematically depicted in FIG. 2e, it should be appreciated that the total number of sub-layers both in the high-k dielectric layer 204 and in each of the sub-regions 204a-c may vary significantly, and in many embodiments may be substantially greater, such as dozens or even hundreds of sub-layers.

After completion of the high-k dielectric layer 204, further device processing may continue, e.g., by forming a metal gate electrode material layer (not shown), made up of one or more of the previously described work-function materials, above the high-k dielectric layer 204.

FIGS. 3a-3e schematically depict another illustrative embodiment of the presently disclosed techniques, wherein the various steps previously described with respect to FIGS. 2a-2e above may be performed in a substantially different overall sequence.

Figure 3A:
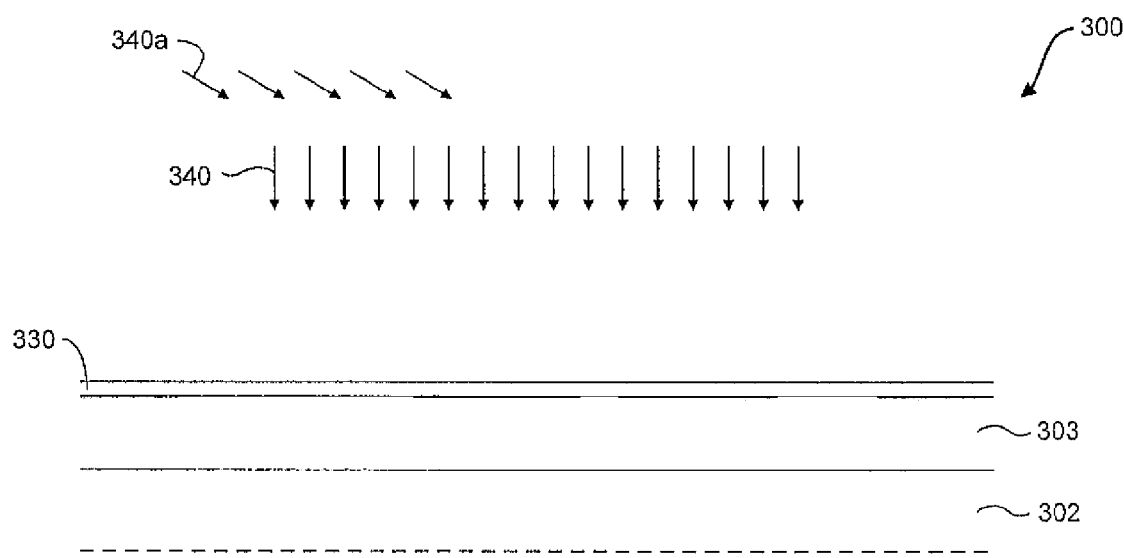
FIGS. 3a-3e schematically illustrate another embodiment of the present disclosure.
Figure 3B:
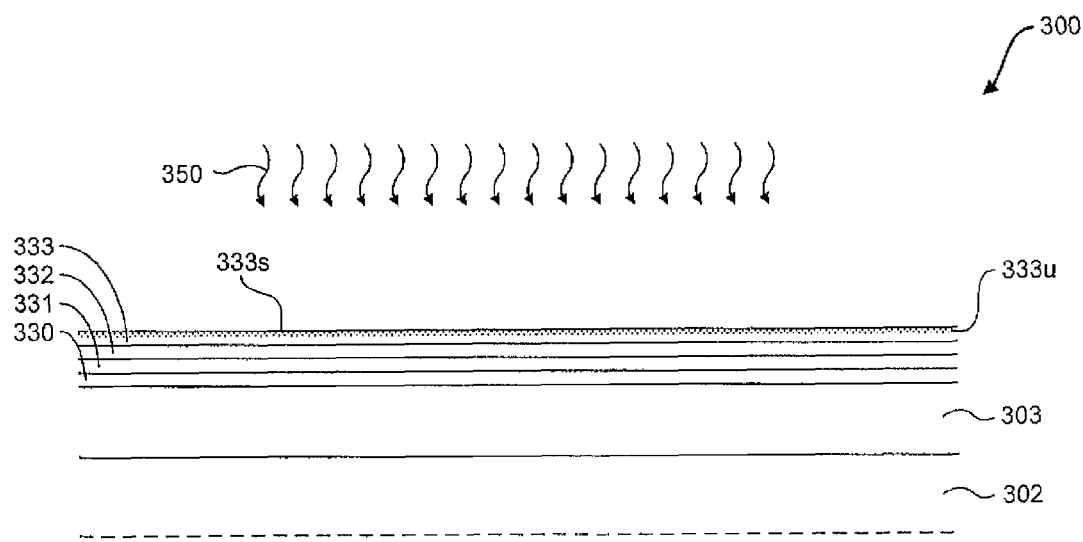

FIG. 3a schematically illustrates a semiconductor device 300 that is similar in many respects to the semiconductor device 200 of FIG. 2a. However, as shown in FIG. 3a, an initial sub-layer 330 may be formed above the interfacial layer 303 using a deposition ambient during a first pulse step of a material deposition cycle 340 that includes a first gaseous precursor 340a, but does not include a second gaseous precursor. In other words, the initial sub-layer 330 is formed using a first gaseous precursor 340a that is made up of a material component of the high-k dielectric layer 304 (see FIG. 3e), but without including any controlled amounts of passivating material. Furthermore, additional material deposition cycles may be performed so as to form the additional sub-layers 331-333, as shown in FIG. 3b. In some embodiments, the deposition ambient used to form the sub-layers 331-333 may only include the first gaseous precursor, i.e., without the second gaseous precursor comprising the passivating material, so that the sub-layers 331-33 also may not include a controlled amount of passivating material.

As shown in FIG. 3b, the semiconductor device 300 may thereafter be exposed to a gaseous treatment ambient 350 made up of a suitable passivating material (e.g., similar to the gaseous treatment ambient 250 of FIG. 2a described above) so as to passivate point defects that may be present at or near the surface 333s of the sub-layer 333. During exposure to the gaseous treatment ambient 350, point defects that are present in an upper portion 333u of the sub-layer 333 may be passivated as previously described.

Figure 3C:
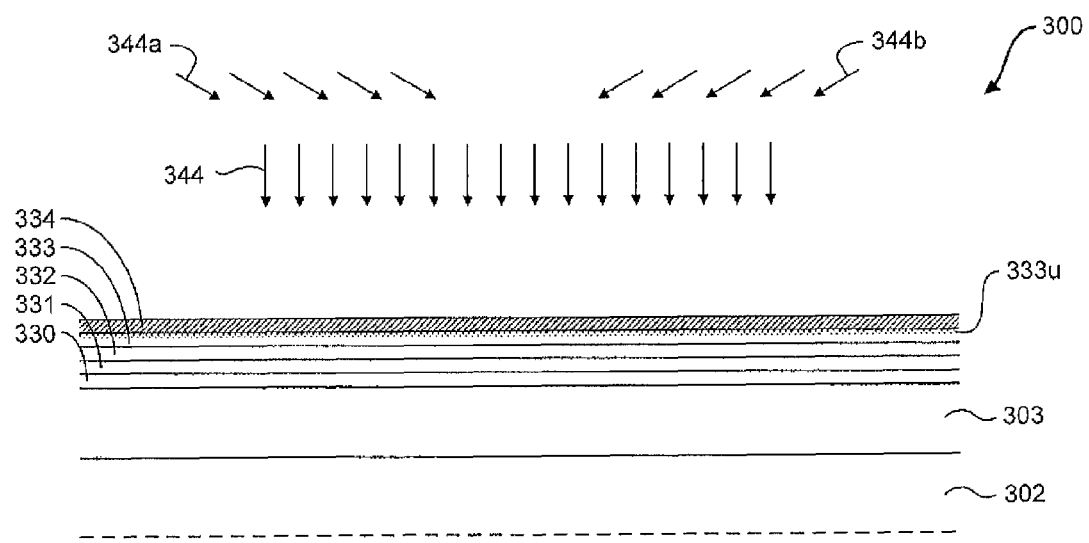

FIG. 3c schematically illustrates the semiconductor device of FIG. 3b in a further advanced stage of the ALD process used to form the high-k dielectric layer 304 (see FIG. 3e), wherein the ALD process is continued by performing a material deposition cycle 344 to form the sub-layer 334. As shown in FIG. 3c, the deposition ambient used to form the sub-layer 334 may include both a first gaseous precursor 344a (made up of a material component of the high-k dielectric material) and a second gaseous precursor 344b (made up of a passivating material), thereby forming the sub-layer 334 with a controlled amount of passivating material. As previously described, the amount and concentration of the passivating material that is incorporated into the sub-layer 334 may be effectively adjusted by controlling one or more of the various parameters used to create the deposition ambient during the first pulse step of the material deposition cycle 344.

Figure 3D:
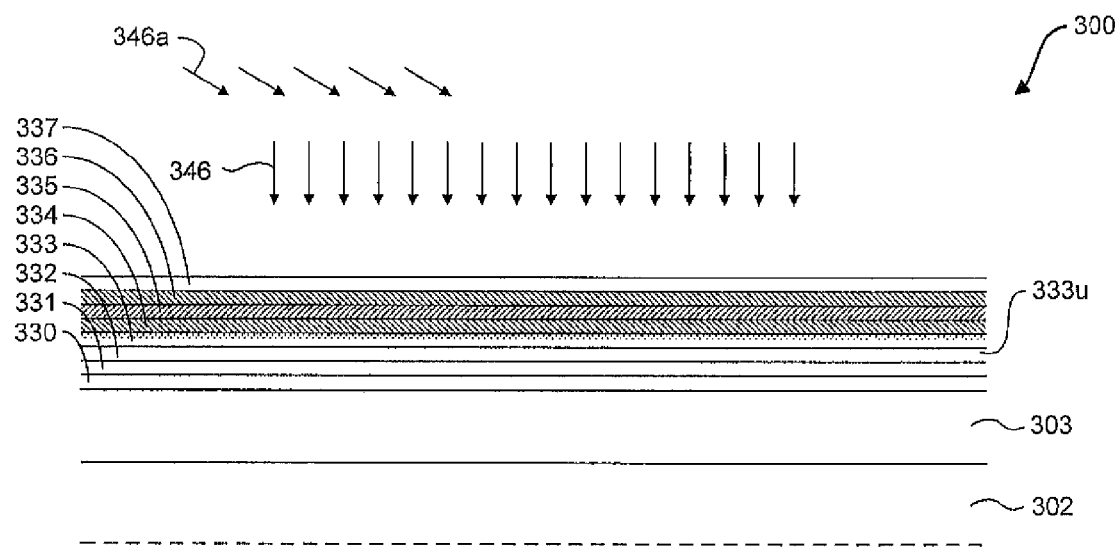

Thereafter, as shown in FIG. 3d, additional sub-layers 335 and 336 may also be formed with a controlled amount of passivating material by utilizing both a first and second gaseous precursor, such as the first and second gaseous precursors 344a and 344b used to form the sub-layer 334. Also as shown in FIG. 3d, a further sub-layer 337 may be formed above the sub-layers 330-336 during a material deposition cycle 346 based on a deposition ambient that includes only the first gaseous precursor 346a, i.e., without a second gaseous precursor, so that the sub-layer 337 does not include a specifically controlled amount of passivating material, as previously described.

Figure 3E:
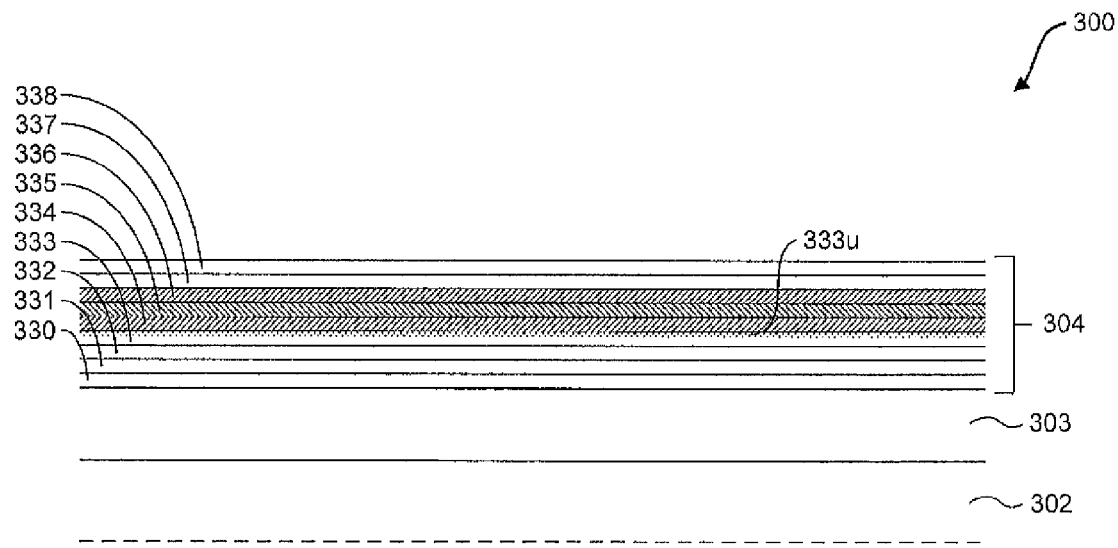

FIG. 3e schematically depicts the illustrative semiconductor device 300 after completion of the ALD process, wherein a completed high-k dielectric layer 304 has been formed above the interfacial layer 303 and the semiconductor material layer 302. As previously noted, the specific number and arrangement of sub-layers shown in FIG. 3e, e.g., the sub-layers 330-338, is for illustrative purposes only, as the actual number of sub-layers that may be required to form the high-k dielectric layer 304 may vary significantly, depending on, for example, the specific type of high-k material that may be used, the desired total thickness and so forth. Further device processing may then continue as previously described, e.g., by depositing one or more metal gate electrode material layers above the high-k dielectric layer 304.

Figure 4:
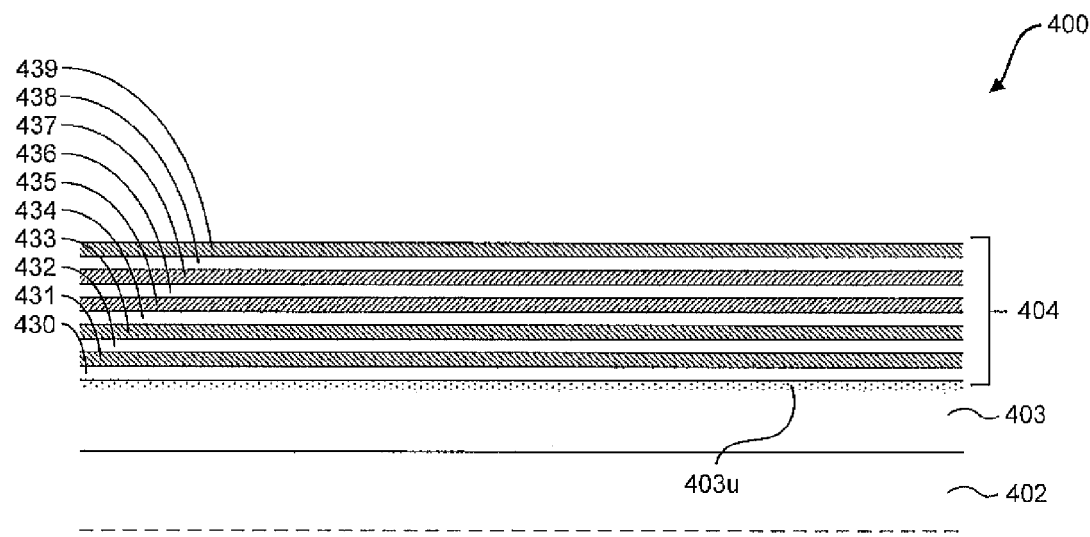
FIG. 4 schematically illustrates a further exemplary embodiment of the techniques disclosed herein.
Figure 5:
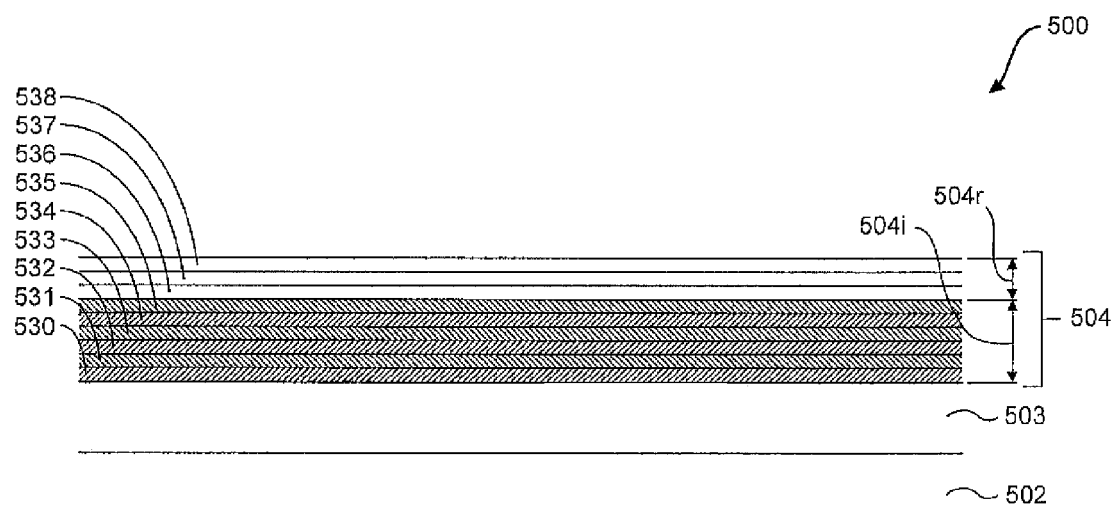
FIG. 5 schematically depicts yet another embodiment of the present disclosure.

FIGS. 4 and 5 schematically illustrate embodiments of the present disclosure wherein different sub-layer arrangements may be used to form the high-k dielectric layer. For example, as shown in the semiconductor device 400 depicted in FIG. 4, an illustrative high-k dielectric layer 404 may be made up of alternating sub-layers (or alternating groups of sub-layers), wherein sub-layers having a controlled amount of passivating material may be sandwiched between adjacent sub-layers that are formed without a controlled amount of passivating material. More specifically, in certain illustrative embodiments, the sub-layers 430, 432, 434, 436 and 438 may be formed during material deposition cycles that utilize a deposition ambient that is based only on a first gaseous precursor, whereas the alternating sub-layers 431, 433, 435, 437 and 438 may be formed using a deposition ambient that has been modified to include both the first gaseous precursor and a second gaseous precursor made up of an appropriate passivating material. Additionally, the interfacial layer 403 may be exposed to a gaseous treatment ambient that also comprises an appropriate passivating material, so that point defects that might be present in an upper portion 403u of the interfacial layer 403 may also be passivated prior to performing an atomic layer deposition process to form the high-k dielectric layer 404. It should be also be appreciated that any one or more of the sub-layers 430-439 may be made up of a plurality of individual layers, as may be required by the parameters of the specific ALD process.

Furthermore, as depicted by the illustrative semiconductor device 500 shown in FIG. 5, the first several sub-layers, e.g., sub-layers 530-535, of the high-k dielectric layer 504 may all be formed during material deposition cycles of an ALD process that utilize a deposition ambient based on a combination of first and second gaseous precursors, i.e., with a specifically controlled amount and concentration of passivating material incorporated therein. Thereafter, after a desired initial thickness 504i of the high-k dielectric layer 504 has been formed, the use of the second gaseous precursor may be discontinued, so that the remaining thickness 504r (e.g., sub-layers 536-538) may be formed substantially without a controlled amount of passivating material.

As a result of the above-described subject matter, several illustrative techniques are disclosed for passivating point defects that may be formed in a high-k dielectric layer by incorporating a passivating material into the high-k dielectric layer during the material deposition process. Furthermore, techniques are also disclosed for passivating point defects that may be present at or near the interface of the high-k dielectric layer and an underlying interfacial layer.

Additionally, it should be appreciated that the above-described techniques may be incorporated into various different integration schemes that may commonly be used for forming high-k/metal gate electrode structures. For example, any of these techniques may be utilized with a gate-first scheme, wherein the gate electrode material stack, including the high-k dielectric layer and the metal gate material, may be formed above a semiconductor material layer prior to performing gate patterning activities. Additionally, the disclosed techniques may also be used in conjunction with a gate-last, or replacement gate, scheme, wherein a dummy gate electrode material stack is formed, a dummy gate structure is patterned, then the dummy gate structure is removed and replaced with a suitable HK/MG gate structure, including the high-k gate dielectric layer and metal gate electrode. Furthermore, the above-described methods may also be used with a so-called "hybrid" replacement gate technique, in which the initially formed gate electrode material stack includes the desired high-k dielectric layer as well as a dummy gate electrode material layer (e.g., polysilicon), which is them patterned to form a dummy gate electrode, wherein, however, only the dummy gate electrode is removed with respect to the high-k gate dielectric layer, and replaced with an appropriate metal gate electrode material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a plurality of material deposition cycles to form a high-k dielectric layer above a semiconductor material layer; and
    introducing a passivating material into a gaseous precursor that is used for forming said high-k dielectric layer during at least one of said plurality of material deposition cycles.

2. The method of claim 1, further comprising forming an interfacial layer above said semiconductor material layer and forming said high-k dielectric layer above said interfacial layer.

3. The method of claim 2, further comprising exposing a surface of said interfacial layer to a gaseous treatment ambient prior to performing an initial one of said plurality of material deposition cycles, said gaseous treatment ambient comprising said passivating material.

4. The method of claim 1, wherein said passivating material comprises one of fluorine and chlorine.

5. A method, comprising:
    forming a layer of high-k dielectric material above a semiconductor layer of a semiconductor device by performing an atomic layer deposition process comprising a plurality of self-limiting deposition cycles, wherein performing each of said plurality of self-limiting deposition cycles comprises forming a sub-layer of said layer of high-k dielectric material by exposing said semiconductor device to a deposition ambient comprising a flow of a first gaseous precursor, said first gaseous precursor comprising a material component of said layer of high-k dielectric material; and
    modifying said deposition ambient during at least one of said plurality of self-limiting deposition cycles to comprise a flow of a second gaseous precursor, said second gaseous precursor comprising a passivating material.

6. The method of claim 5, further comprising, during said atomic layer deposition process, interrupting said flow of said first gaseous precursor and exposing a surface of at least one of said sub-layers of said layer of high-k dielectric material to a gaseous treatment ambient comprising said second gaseous precursor.

7. The method of claim 5, further comprising modifying said deposition ambient during an initial one of said plurality of self-limiting deposition cycles.

8. The method of claim 5, further comprising modifying said deposition ambient after performing an initial one of said plurality of self-limiting deposition cycles.

9. The method of claim 5, further comprising alternatingly forming first and second sub-layer groups, wherein each of said first and second sub-layer groups comprises at least one sub-layer, wherein each sub-layer of said first sub-layer group is formed using said modified deposition ambient, and wherein each sub-layer of said second sub-layer group is formed without using said modified deposition ambient.

10. The method of claim 5, further comprising forming an interfacial layer above said semiconductor layer and forming said layer of high-k dielectric material above said interfacial layer.

11. The method of claim 10, further comprising exposing a surface of said interfacial layer to a gaseous treatment ambient prior to forming said layer of high-k dielectric material, said gaseous treatment ambient comprising said second gaseous precursor.

12. The method of claim 5, wherein said high-k dielectric material comprises hafnium dioxide and said first gaseous precursor comprises hafnium tetrachloride.

13. The method of claim 5, wherein said passivating material comprises one of fluorine and chlorine.

14. The method of claim 5, wherein said passivating material comprises fluorine and said second gaseous precursor comprises one of nitrogen trifluoride and hydrogen tetrafluoride.

15. The method of claim 5, wherein modifying said deposition ambient during said at least one of said plurality of self-limiting deposition cycles comprises controlling an amount of said passivating material that is incorporated into said layer of high-k dielectric material by adjusting at least one process parameter of said modified deposition ambient.

16. The method of claim 15, wherein adjusting said at least one process parameter of said modified deposition ambient comprises adjusting at least one of a reaction temperature, chamber pressure, flow rate of said first gaseous precursor, and flow rate of said second gaseous precursor.

17. A method, comprising:
  forming an interfacial layer above a semiconductor layer of a semiconductor device;
  performing an atomic layer deposition process to deposit a high-k dielectric layer above said interfacial layer, wherein performing said atomic layer deposition process comprises exposing said semiconductor device to a first gaseous precursor;
  incorporating a passivating material into said high-k dielectric layer, wherein incorporating said passivating material comprises combining a second gaseous precursor with said first gaseous precursor during at least one deposition cycle of said atomic layer deposition process; and
  controlling an amount of said passivating material that is incorporated into said high-k dielectric layer, wherein controlling said amount comprises adjusting at least one of a reaction temperature, chamber pressure, flow rate of said first gaseous precursor, and flow rate of said second gaseous precursor during said at least one deposition cycle.

18. The method of claim 17, wherein said high-k dielectric layer comprises hafnium dioxide and said first gaseous precursor comprises hafnium tetrachloride.

19. The method of claim 17, wherein said passivating material comprises fluorine and said second gaseous precursor comprises one of nitrogen trifluoride and hydrogen tetrachloride.

20. The method of claim 17, further comprising forming a metal gate electrode material layer above said high-k dielectric layer.

21. The method of claim 1, wherein performing each of said plurality of material deposition cycles comprises performing a plurality of sequential pulse/purge steps.

22. The method of claim 21, wherein performing said plurality of sequential pulse/purge steps comprises:
  performing a first pulse step in a reaction chamber to expose a surface where said high-k dielectric layer is being formed to said gaseous precursor, wherein a first material sub-layer is formed above said surface during said first pulse step;
  after performing said first pulse step, performing a first purge step to remove at least reaction byproducts from said reaction chamber;
  after performing said first purge step, performing a second pulse to introduce an oxidant into said reaction chamber; and
  after performing said second pulse step, performing a second purge step to remove said oxidant from said reaction chamber.

* * * * *

UNITED STATES PATENT AND TRADEMARK OFFICE
CERTIFICATE OF CORRECTION

| | | |
|---|---|---|
| PATENT NO. | : 8,658,490 B2 | Page 1 of 1 |
| APPLICATION NO. | : 13/439016 | |
| DATED | : February 25, 2014 | |
| INVENTOR(S) | : Erben et al. | |

It is certified that error appears in the above-identified patent and that said Letters Patent is hereby corrected as shown below:

In the Claims

In claim 22, at column 16, line 35, after "pulse", insert -- step --.

Signed and Sealed this
Twenty-seventh Day of May, 2014

Michelle K. Lee
*Deputy Director of the United States Patent and Trademark Office*